(12) United States Patent
Pillans et al.

(10) Patent No.: US 12,171,064 B2
(45) Date of Patent: Dec. 17, 2024

(54) INTERCONNECT AND METHOD FOR MANUFACTURING THE SAME

(71) Applicant: Raytheon Company, Waltham, MA (US)

(72) Inventors: Brandon W. Pillans, Plano, TX (US); Robert Manley, Allen, TX (US); Monte R. Sanchez, Murphy, TX (US)

(73) Assignee: RAYTHEON COMPANY, Waltham, MA (US)

( * ) Notice: Subject to any disclaimer, the term of this patent is extended or adjusted under 35 U.S.C. 154(b) by 567 days.

(21) Appl. No.: 17/192,853

(22) Filed: Mar. 4, 2021

(65) Prior Publication Data

US 2022/0287179 A1 Sep. 8, 2022

(51) Int. Cl.
| | |
|---|---|
| *H01R 13/24* | (2006.01) |
| *H01R 12/71* | (2011.01) |
| *H01R 43/20* | (2006.01) |
| *H05K 1/11* | (2006.01) |
| *H01R 13/621* | (2006.01) |
| *H05K 3/00* | (2006.01) |
| *H05K 3/16* | (2006.01) |

(52) U.S. Cl.
CPC ........... *H05K 1/119* (2013.01); *H01R 12/714* (2013.01); *H01R 43/205* (2013.01); *H01R 13/621* (2013.01); *H05K 3/0026* (2013.01); *H05K 3/16* (2013.01); *H05K 2201/09036* (2013.01); *H05K 2201/09445* (2013.01); *H05K 2201/09754* (2013.01); *H05K 2201/10318* (2013.01)

(58) Field of Classification Search
CPC ........ H05K 1/119; H05K 3/0026; H05K 3/16; H05K 2201/09036; H05K 2201/09445; H05K 2201/09754; H05K 2201/10318; H05K 3/4007; H01R 12/714; H01R 43/205; H01R 13/621; H01R 12/7076; H01R 13/2414; H01R 12/7082
See application file for complete search history.

(56) References Cited

U.S. PATENT DOCUMENTS

| | | | |
|---|---|---|---|
| 5,017,145 A | 5/1991 | Kanai et al. | |
| 5,455,738 A | 10/1995 | Montesano et al. | |

(Continued)

OTHER PUBLICATIONS

Pouchworth, Metalized PET Pouches—MET/PET, VMPET, or MPET, https://www.pouchworth.com/metalized-pet-film/, retrieved on Mar. 4, 2021, 4 pages, Pouch Worth, Upland, California.

(Continued)

*Primary Examiner* — Abdullah A Riyami
*Assistant Examiner* — Nelson R. Burgos-Guntin
(74) *Attorney, Agent, or Firm* — CANTOR COLBURN LLP

(57) ABSTRACT

An interconnect is provided that can comprise a recess formed in a body where the recess comprises an axial end wall and a side wall extending from the axial end wall. The interconnect can also comprise a distributed metallized layer disposed on the axial end wall and the side wall and a conductive compliant (CC) plug disposed within the recess to interface with the metallized layer. The CC plug can be configured to establish an electrical connection between a conductive pad disposed on the recess and a male conductive element inserted into the recess via the metallized layer.

19 Claims, 6 Drawing Sheets

(56) References Cited

U.S. PATENT DOCUMENTS

| | | | | |
|---|---|---|---|---|
| 5,664,953 | A * | 9/1997 | Reylek | H01R 13/2414 439/111 |
| 5,896,655 | A * | 4/1999 | Knodler | H01R 43/20 29/878 |
| 6,720,500 | B1 | 4/2004 | Inoue | |
| 6,814,584 | B2 | 11/2004 | Zaderej | |
| 7,262,075 | B2 | 8/2007 | Aggarwal et al. | |
| 7,728,611 | B1 * | 6/2010 | Kraynak | G01R 1/06738 324/754.09 |
| 7,922,544 | B2 * | 4/2011 | Chung | G01R 1/06722 439/700 |
| 8,048,366 | B2 | 11/2011 | Zhu et al. | |
| 9,865,952 | B2 | 1/2018 | Bagung et al. | |
| 9,923,293 | B2 | 3/2018 | Swernofsky et al. | |
| 10,009,998 | B1 | 6/2018 | Ozaki et al. | |
| 10,412,840 | B1 | 9/2019 | Marggraff et al. | |
| 2002/0022383 | A1 * | 2/2002 | Sakata | H01R 12/52 439/66 |
| 2002/0070437 | A1 * | 6/2002 | Heerman | H01L 23/49827 257/678 |
| 2003/0096513 | A1 * | 5/2003 | Belopolsky | H01R 13/03 439/68 |
| 2005/0009386 | A1 * | 1/2005 | Weiss | H01R 12/613 439/91 |
| 2005/0286238 | A1 | 12/2005 | Joy | |
| 2006/0166479 | A1 * | 7/2006 | Seo | H01R 12/714 438/618 |
| 2007/0160808 | A1 * | 7/2007 | Okuda | H01R 13/2414 428/137 |
| 2008/0032522 | A1 * | 2/2008 | Gilliland | H05K 1/144 439/74 |
| 2008/0188127 | A1 * | 8/2008 | Alden | H05K 7/1061 439/607.05 |
| 2008/0227307 | A1 * | 9/2008 | Alden | H01R 12/714 439/66 |
| 2008/0242128 | A1 * | 10/2008 | Hilty | H01R 13/2414 439/91 |
| 2009/0159325 | A1 * | 6/2009 | Yamada | H01R 13/2414 174/262 |
| 2010/0155940 | A1 * | 6/2010 | Kawashita | H01L 25/0657 257/737 |
| 2011/0070750 | A1 * | 3/2011 | Reisinger | H01R 13/2442 439/66 |
| 2011/0298123 | A1 | 12/2011 | Hwang et al. | |
| 2012/0171907 | A1 * | 7/2012 | Rathburn | H05K 1/141 439/700 |
| 2013/0210276 | A1 * | 8/2013 | Rathburn | H01R 11/16 439/620.22 |
| 2013/0337666 | A1 * | 12/2013 | Walczyk | H01R 12/712 29/832 |
| 2014/0017942 | A1 * | 1/2014 | Mason | H01R 12/73 439/607.17 |
| 2014/0242816 | A1 * | 8/2014 | Rathburn | H01R 12/52 29/874 |
| 2015/0372408 | A1 * | 12/2015 | Warwick | H01R 43/26 439/86 |
| 2018/0261938 | A1 * | 9/2018 | Petit | H01R 43/24 |
| 2020/0169014 | A1 * | 5/2020 | Goetz | H05K 3/325 |
| 2021/0071830 | A1 * | 3/2021 | Sinofsky | H01R 43/26 |
| 2022/0022348 | A1 * | 1/2022 | Williams | H05K 1/144 |
| 2022/0287179 | A1 * | 9/2022 | Pillans | H01R 43/205 |

OTHER PUBLICATIONS

"Lockheed Martin Announces $100 Million Venture Fund Increase" Jul. 8, 2018, Retrieved from: 6. https://www.avm-mag.com/lockheed-martin-announces-100-million-venture-fund-increase/, 6 pages.

"Metalized PET Pouches - Met/Pet, Vmpet, or MPET", SilverDollar & GoldMetal, Retrieved from: https://www. pouchworth.com/metalized-pet-film/. Retrieved on Mar. 4, 2021, 4 pages.

"Renishaw showcases metal AM implants to American Academy of Orthopaedic Surgeons", Mar. 6, 2018, Retrieved from: 8. https://www.metal-am.com/renishaw-showcases-metal-implants-american-academy-orthopaedic-surgeons/.

https://ars.els-cdn.com/content/image/1-s2.0-S2214860418300174-gr1_lrg.jpg, 1 page.

Müller, et al. "Additive manufacturing of pure tungsten by means of selective laser beam melting with substrate preheating temperatures up to 1000C", Nuclear Materials and Energy, vol. 19, May 2019, pp. 184-188 (Abstract Only).

Xu et al. "Structurally Efficient Three-dimensional Metamaterials with Controllable Thermal Expansion" Sci Rep Oct. 10, 2016: 2 pages.

* cited by examiner

INTERCONNECT AND METHOD FOR MANUFACTURING THE SAME

BACKGROUND

The present disclosure relates to interconnect assemblies. In electronics, connectors are often used to transmit one or more signals from, for example, one circuit board to another. Some applications require interconnects in arrays of hundreds of connectors per square inch of circuit board area. This creates a need for small-pitch connectors that are highly reliable and that are low cost.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1:
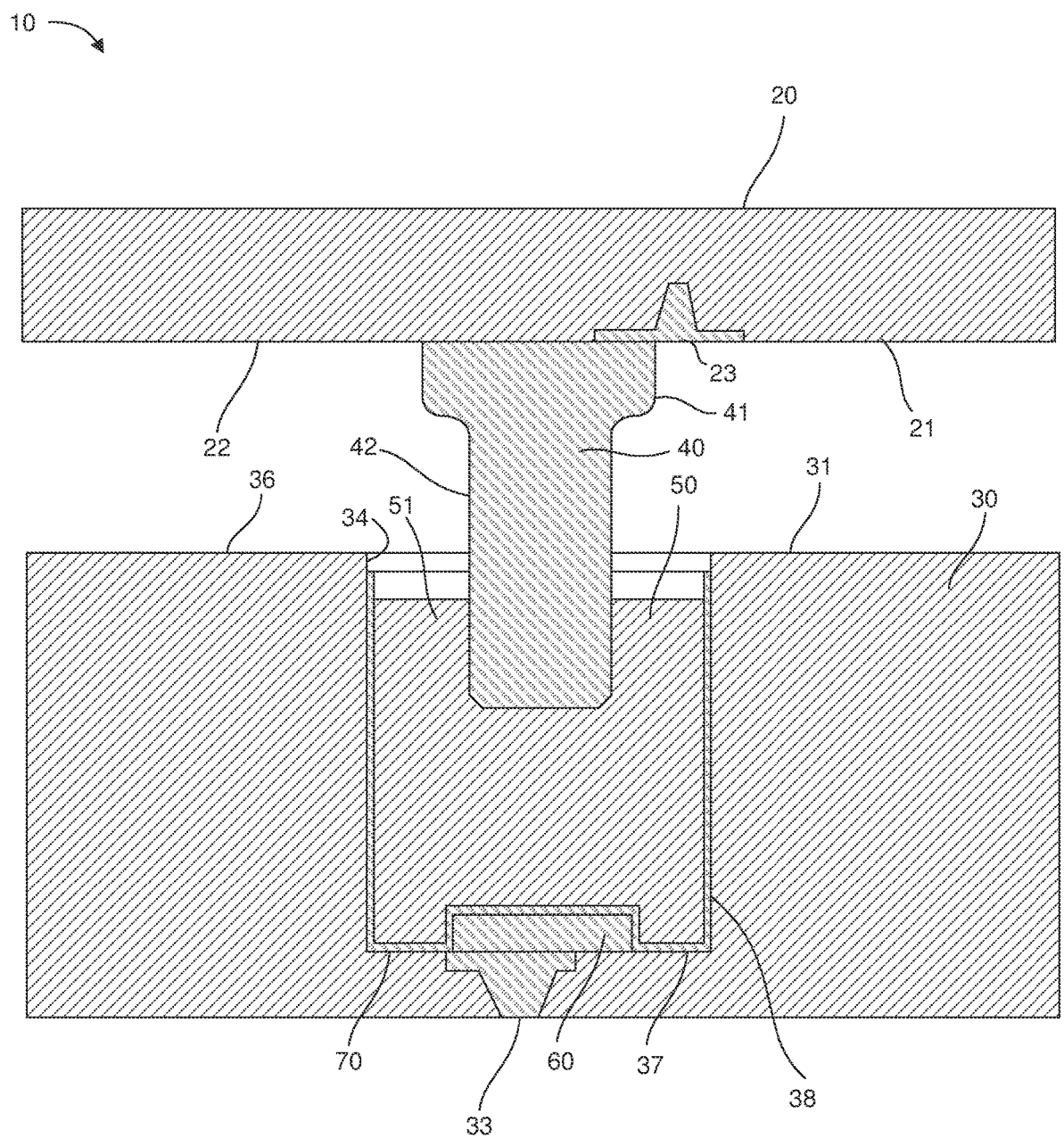
FIG. 1 is a partial section view of an exemplary interconnect.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

One example of an interconnect is provided in U.S. Pat. No. 9,923,293 which was issued on Mar. 20, 2018, the contents of which are hereby incorporated by reference. The present disclosure sets forth an interconnect to improve the resistance properties of the interconnect at varying pin insertion depths. More specifically, the present disclosure sets forth an interconnect that can facilitate a reliable and consistent electrical connection even with differences in pin insertion depths due to variances in manufacturing. In other words, the interconnect set forth herein provides a low resistance connection that reliably and consistently transmits electrical signals through the interconnect even when taking into account variances in pin insertion depths or material variations.

An initial overview of the inventive concepts are provided below and then specific examples are described in further detail later. This initial summary is intended to aid readers in understanding the examples more quickly, but is not intended to identify key features or essential features of the examples, nor is it intended to limit the scope of the claimed subject matter.

The present disclosure sets forth an interconnect. In one example, an interconnect can comprise a recess formed in a body, and comprising an axial end wall and a side wall extending from the axial end wall to the outer surface. The interconnect can also comprise a distributed metallized layer disposed on the axial end wall and the side wall and a conductive compliant (CC) plug disposed within the recess to interface with the metallized layer. The CC plug can be configured to establish an electrical connection between a conductive pad disposed in the recess and a male conductive element inserted into the recess via the metallized layer.

In one example, the male conductive element can comprise a pin connector. The conductive pad can be disposed on the axial end wall of the recess.

In one example, at least a portion of the distributed metallized layer can be disposed on the conductive pad. In one example, the CC plug can comprise at least one of more of conductive polymer, foamed metal, and conductive foamed plastic.

In one example, the distributed metallized layer completely covers the axial end wall and side wall of the recess.

In another example, the present disclosure sets forth an interconnect assembly. The interconnect assembly comprises a first body comprising a male conductive element supported on an outer surface of the first body.

The interconnect assembly can also comprise a second body having second circuitry. The second body can comprise a recess disposed on an outer surface of the second body. The interconnect assembly can also comprise a distributed metallized layer that can be disposed within the recess and that can be in electrical connection with the second circuitry. The interconnect assembly can also comprise a conductive compliant (CC) plug that can be disposed within the recess to interface with the metallized layer.

In one example, the second body further comprises a conductive pad that can be disposed on an axial end wall of the recess. The conductive pad can be in electrical connection with the second circuitry and the distributed metalized layer. The distributed metallized layer can be disposed on the conductive pad.

In one example, the CC plug can comprise at least one of more of a conductive polymer, foamed metal, and conductive foamed plastic. The second body can comprise multiple recesses in array, each of the recesses comprising a respective distributed metallized layer and a CC plug, and the first body can comprise multiple male conductive elements in array. Each of the multiple male conductive elements can be inserted, at least partially, into a respective one of the multiple recesses of the second body.

In one example, the first body can comprise first circuitry in electrical connection with the male conductive element.

In one example, the interconnect assembly can further comprise a third body where the third body comprises a recess disposed on an outer surface of the third body and a distributed metalized layer disposed, at least in part, within the recess of the third body. The first body can be an intermediate carrier comprising a second male conductive element supported on a second outer surface of the first body. The male conductive element can be inserted into the recess of the second body, and the second male conductive element can be inserted into the recess of the third body.

The third body can comprise multiple recesses in array, each of the recesses of the third body comprising a respective distributed metalized layer and a CC plug. The intermediate carrier can comprise multiple second male conductive elements in array inserted into a respective one of the multiple recesses of the third body.

The present disclosure also sets forth a method for manufacturing an interconnect. The method can comprise forming recess in a body. The recess can comprise an axial end wall and a side wall extending from the axial end wall. A connection pad can be disposed on the axial end wall. The method can further comprise depositing a metallized layer to be distributed within the recess on the axial end wall and the side wall to be in electrical connection with the connection pad, and inserting a conducting compliant (CC) plug into the recess. The CC plug being can be configured to establish an electrical connection between the connection pad and a male conductive element inserted into the recess via the metallized layer.

In one example, the metallized layer can be deposited via a sputtering process. The recess can be formed via etching or laser machining the recess out of the body. The method can further comprise forming an array of recesses.

The metallized layer can be deposited in an uninterrupted layer throughout an area where the metallized layer and the CC plug overlap within the recess. The metallized layer can substantially cover the axial end wall and the side wall. The body can be formed as a part of a printed circuit board.

To further describe the present technology, examples are now provided with reference to the figures. With reference to FIG. 1, an exemplary interconnect 10 is provided that is operable to provide an electrical connection between a first body 20 and a second body 30. The first body 20 can be provided or configured as a first circuit board 21, as shown in FIG. 1. The first body 20 can be a part of a chip package that comprises a plurality of pin connectors. The first body 20 can further comprise circuitry, such as first circuitry 23. The first circuitry 23 shown in FIG. 1 is exemplary and not intended to be limiting in any way. Indeed, the first circuitry 23 can be formed in any desired manner, including a trace, a via, or a combination thereof. Moreover, rather than being configured as a circuit board, alternatively, the first body 20 can be configured as a microchip, a connector portion (e.g., a male connector portion), or any other type of body that is capable of supporting the interconnect 10, or an array of such interconnects.

The second body 30 can be provided or configured as a second circuit board 31 or as a chip package and can also comprise circuitry, such as second circuitry 33. The second circuitry 33 shown in FIG. 1 is exemplary and not intended to be limiting in any way, and could be formed in any desired manner including a trace, via, or a combination thereof.

The interconnect 10 can comprise a male conductive element, which in the example shown comprises a pin connector 40. The interconnect 10 can further comprise a recess 34 sized and configured to receive the male conductive element, in this case the pin connector 40. In this example, the recess 34 can be formed to extend into the second body 30 from an outer surface 36. In one example, the recess 34 can have a substantially cylindrical or frustoconical shape with an axial end wall or bottom surface 37 that can be, but is not required to be, parallel with the outer surface 36 of the second body 30, and a sidewall 38 extending between the axial end wall 37 and the outer surface 36, where the axial end wall 37 and the sidewall 38 define a depth of the recess 34. While the recess 34 is shown in FIG. 1 as being formed with and extending into the second body 30 from the outer surface 36, other variations are also possible. For example, the interconnect 10 can alternatively comprise an interfacing structure operable to be connected to or otherwise supported by the second body 30 and that is formed with one or more pockets having recesses, similar the recess 34 shown in FIG. 1. The interfacing structure can be sized and configured to be supported on or about the outer surface 36 of the second body 30.

The first body 20 and the second body 30 can be formed using any suitable method now known or later developed, such as manufacturing layers of non-conductive and conductive printed wiring board materials with desired first and second circuitry 23, 33 to form the first and second bodies 20, 30. The recess 34 can be formed using an additive manufacturing process by building up the layers of the second body 30 and masking the area of the recess 34 to form the recess 34. In another aspect, the recess 34 can be formed by removing material from a formed second body 30 to create the recess 34, such as by etching or laser machining. In one example, the first body 20 and the second body 30 can comprise printed circuit boards. In another example, the first body 20 and the second body 30 can be formed of nonconductive materials that are attached to other bodies to be connected.

The pin connector 40 can be supported on an outer surface 22 of the first body 20. In one example, the pin connector 40 can be entirely formed of electrically conductive materials, such as various metals or other materials known for having and providing good electrical connection properties. In one example, the pin connector 40 can comprise a base portion 41 secured to the outer surface 22 of the first body 20, and a pin 42 extending away from the base portion 41. It is to be understood that the pin connector 40 need not comprise a base portion 41. As such, in another example, the pin connector 40 can comprise only the pin 42, which can be secured to the outer surface 22 of the first body 20. In the example with the pin connector 40 comprising the base portion 41, the base portion 41 can be soldered or adhered with conductive epoxy to the first body 20 to interface with the first circuitry 23 to form an electrical connection with the first circuitry 23. The pin 42 can be integrally formed with or connected to the base portion 41 and can extend axially away from the base portion 41. A diameter or width of the base portion 41 can exceed that of the pin 42, whereas an axial length of the pin 42 can exceed an axial length of the base portion 41. Where the pin connector 40 does not comprise a base portion 41, the pin 42 can be attached, soldered or otherwise secured to the first body 20 directly to electrically interface with or connect with the electrical circuitry 23.

The interconnect 10 can further comprise a conductive compliant ("CC") plug 50 that can be disposed and secured within the recess 34, and that can include a plug body 51 that is formed of one or more compliant materials. Examples of compliant materials can include, but are not limited to, conductive compliant polymeric materials, compliant foamed metallic materials, and compliant foamed conductive plastic materials, or combinations thereof. The compliant materials can be compliant up to a certain degree beyond which they are subject to compressive failure. The CC plug 50 can further comprise embedded conductive materials dispersed throughout the plug body 51 so as to provide or enable the conductive properties of the CC plug 50. In one example, conductive silver flakes can be distributed within a non-conductive compliant polymeric matrix as part of a composite of materials used to form the CC plug 50. The conductive compliant materials can thus facilitate or provide a plurality of conductive paths through the CC plug 50 via the embedded conductive materials.

In one example, the CC plug 50 can have, but is not required to have, a similar shape as the recess 34. Thus, if the recess 34 is substantially cylindrical, the CC plug 50 can also be substantially cylindrical. Alternatively, and depending upon the composition of the CC plug material, disposition of the CC plug 50 into the recess 34 can be achieved by liquid dispensation of the CC plug material into the recess 34 and subsequent in situ curing of the CC plug material. In these or other cases, the resulting CC plug 50 can be at least partially secured within the recess 34 by surface adhesion.

The pin connector 40 and the recess 34 can be disposed in positional correspondence with one another. Thus, when the first and second bodies 20 and 30 are brought together, the pin 42 is caused to be inserted at least partially into the plug body 51 of the CC plug 50 (e.g., into a pre-existing pin hole in the CC plug 50 or into the plug body 51 whereupon the pin 42 forms its own pin-hole). When the pin 42 is inserted into the CC plug 50, the CC plug material is compressed which helps facilitate the generation of electrical paths through the embedded conductive materials of the CC plug to form an electrical connection between the pin connector 40 and the CC plug 50.

A conductive pad 60 can be provided on or adjacent to the axial end wall 37 of the recess 34. The conductive pad 60 can provide a conductive path at the axial end wall 37 to the second electronics circuitry 33 from the CC plug 50. The conductive pad 60 can be formed of any suitable conductive material such as copper or other conductive materials.

The combination of the pin connector 40, the recess 34, the conductive pad 60, and the CC plug 50 can be termed an interconnect. The interconnect forms the electrical connection between the first body 20 and the second body 30. The combination of the interconnect 10, the first body 20, and the second body 30 can be termed an interconnect assembly or a connectable assembly.

In prior interconnects, due to manufacturing variability, the insertion depth of a pin into a CC plug can be variable. That is, a distance between an end of the pin and a conductive pad disposed at a bottom of a recess can vary. It has been found that the resistance in an electrical circuit created using prior interconnects can be relatively high and unreliable in cases where there is a shallow insertion depth of the pin within the CC plug. This can be because the conductive paths through the CC plug (such as conductive paths that jump from one embedded conductive material to another through the non-conductive polymeric matrix of the CC plug) are relatively longer at shallow insertion depths as compared to deeper insertion depths of the pin within the CC plug. This can also be because at shallow insertion depths, the material of the CC plug is not as compressed when compared to deeper insertion depths of the pin into the CC plug. This can result in lower compression of the CC plug materials, such as in the lower regions of the CC plug. This lower compression of the material of the CC plug leads to the creation of fewer electrical paths through the embedded conductive materials of the CC plug, or to the absence of any low resistance electrical paths through the CC plug.

In one prior art example, a diameter of the pin of the pin connector was approximately 8 mils, and a diameter of the recess was approximately 19 mils. Resistance of a connection created by the prior art interconnect was tested at insertion depths ranging from 3 mils to 23 mils into the CC plug in the recess. In this example, inconsistent resistances were found to occur at insertion depths less than approximately 9 mils, such as resistances of well over 1 Ohm, for example, between 3-6 Ohms or higher. These resistances were correlated with unreliable electrical connections using the prior interconnects. On the other hand, insertion depths greater than approximately 9 mils had resistances generally less than 1 Ohm that correlated with more stable electrical connections. Thus, there is a need to decrease the resistance at shallow insertion depths (and to provide consistent, low resistances across all insertions depths) to allow the interconnects to be reliable despite potential differences in insertion depths across an array of interconnects due to normal manufacturing variances.

Referring again to FIG. 1, the interconnect 10 can further comprise a metallized layer 70, which can be disposed within the recess 34 on the axial end wall 37, the sidewall 38, and the conductive pad 60 so as to be in electrical connection with the CC plug 50 and the conductive pad 60. In one example, the metallized layer 70 can be deposited into the recess 34 prior to the CC plug 50. In one example, the metallized layer 70 can be deposited into the recess 34 via a physical vapor deposition process such as sputtering. The metallized layer 70 can be formed from a conductive material such as gold or copper or others. The metallized layer 70 can be deposited within the recess 34 to create a layer that completely covers the side wall 38, axial end wall 37, and conductive pad 60. In another example, the metallized layer 70 can be deposited to form a distributed layer within the recess 34, such as via a sputtering process, wherein the metallized layer is deposited onto the side wall 38, the axial end wall 37 and the conductive pad 60. In another example, the metallized layer 70 can be deposited within the recess 34 such that a plurality of discrete metallized paths are formed and distributed along the side wall 38, the axial end wall 37 and conductive pad 60. It is noted herein that the metalized layer 70 can be deposited within the recess 34 to completely cover the sidewall 38, the axial end wall 37 and the conductive pad 60. In another aspect, the metalized layer 70 can be deposited within the recess 34 in a discontinuous manner, or in other words, the metalized layer 70 can comprise one or more discontinuities while still providing the functionality described herein.

The metallized layer 70 deposited over the sidewall 38 of the recess 34 provides the interconnect 10 with low resistance conductive paths through the CC plug 50 even at shallow insertion depths of the pin 42. Specifically, the metallized layer 70 distributed on the sidewall 38, the axial end wall 37, and the conductive pad 60 facilitates the flow of current along a variety of paths from the pin 42 to the metallized layer 70 through the CC plug. With prior art interconnects having pins inserted at shallow insertion depths, only longer paths extending from the tip of the pin to the conductive pad through the CC plug are facilitated, which can result in higher resistances. Further, as discussed above, prior art interconnects can result in insufficient compression of the CC plug material, such as in lower regions of the CC plug material, to facilitate low-resistance electrical paths through the CC plug material.

Unlike prior interconnects, the interconnect 10 discussed herein and shown in FIG. 1, comprising the metallized layer 70, can facilitate shorter and more consistent conductive paths through the CC plug 50 no matter how shallow the pin 42 is inserted into the CC plug because the radial length from the pin 42 to the deposited metal on the sidewall 38 of the recess 34 is constant as the pin 42 is inserted. For instance, the metallized layer 70 can facilitate the flow of current within the recess 34 along any one or more of radial or lateral paths from the pin 42 to the metallized layer 70 through the CC plug 50. As can be seen from FIG. 1, such radial or lateral conductive paths through the CC plug 50 to the metallized layer can be a shorter distance as compared to prior interconnects where a conductive path would need to travel a longer distance through a CC plug to create a connection (e.g., such as would be the case with interconnects comprising trace elements).

Further, again referencing FIG. 1, due the distributed nature of the metallized layer 70 within the recess 34, the conductive path are paths of least resistance and can be formed in any direction from the pin 42 though the CC plug 50 and to the metallized layer 70. For example, the metallized layer 70 facilitates radial conductive paths in any direction from the pin 40, as well as longitudinal conductive paths within the CC plug 50 along axes parallel to the sidewall 38 of the recess 34 or a longitudinal axis of the pin 42, or along any directional path of least resistance from the pin 42 through the CC plug 50 to the metallized layer 70. The current can then flow through the metallized layer 70 to the conductive pad 60.

Additionally, while a shallow insertion depth of the pin 42 into the CC plug 50 can result in low compression of material of the CC plug 50 in a lower portion of the CC plug 50, the pin 42 can still provide sufficient radial compression of the material of the CC plug 50 from the pin 42 to the metallized layer 70. This radial compression of the material of the CC plug 50 thus also helps to facilitate lower resistance electrical paths radially through the CC plug 50 to the metallized layer 70.

Advantageously, the interconnect 10 with the metallized layer 10 can greatly reduce the resistance no matter the insertion depth of the pin 42, and can provide a constant, consistent, and reliable resistance across variable insertion depths of the pin 42. This is because the distributed metalized 70 layer facilitates a large number of possible conductive paths for the flow of current between the pin 42 and the metallized layer 70 through the CC plug 50 (e.g., as compared to the limited conductive paths provided by trace elements in prior art interconnects), and specifically facilitates shorter conductive paths, or facilitates the ability of the current to find the path of least resistance, through the conductive compliant material of the CC plug 50.

The consistency and reliability of the electrical connection facilitated by the interconnect 10 can increase in correlation with the coverage of the metallized layer 70 throughout the recess 34. In one example, the metallized layer 70 can be distributed within the recess 34 so as to cover all or substantially all of the exposed surfaces of the sidewall 38, the axial end wall 37, and the conductive pad 60. In another example, the metallized layer 70 can be formed so as to partially cover the exposed surfaces of the sidewall 30, the axial end wall 37, and the conductive pad 60 (e.g., the metallized layer can cover at least 80% of the exposed surfaces of sidewall 30, the axial end wall 37, and the conductive pad 60). In still another example, the coverage of the metallized layer 70 can be uninterrupted along the axial end wall 37 and conductive pad 60 and at least partially along the side wall 38. In still another example, the metallized layer 70 can be deposited in a manner such that it is uninterrupted within the recess 34 at least where it overlaps with the CC plug 50 within the recess 34. By uninterrupted, it is meant that there are no holes, gaps, or other discontinuities in the metallized layer 70. In any case, the coverage of the metallized layer 70 can be such that multiple potential directional conductive paths are created or established between the pin 42 and the metallized layer 70 through the CC plug 50, upon insertion of the pin 42.

In operation, when the pin 42 is inserted into the CC plug 50, a radial compression of the CC plug 50 is sufficient to encourage the reliable formation of an electrical connection between the pin 42 and the CC plug 50. With the metallized layer 70 at least partially distributed within the recess 34 along the sidewall 38 to facilitate multiple directional conductive paths between the pin 40 and the metallized layer 70, a reliable electrical connection between the pin 42 and the metallized layer 70 through the CC plug 50 is established. In this manner, an electrical pathway can be formed from the first circuitry 23 to the pin connector 40, from the pin connector 40 to the CC plug 50, from the CC plug 50 to the metallized layer 70, from the metallized layer 70 to the conductive pad 60, and from the conductive pad 60 to the second circuitry 33.

An example of the increased reliability of the interconnect 10 will now be provided. Similar to the example provided above regarding a prior art interconnect, this example comprises an interconnect configured as discussed herein with a metalized layer (such as interconnect 10 having metalized layer 70) having a diameter of the pin connector of approximately 8 mils, and a diameter of the recess of approximately 19 mils, the recess comprising a metalized layer. Resistance of a connection provided by the interconnect was tested at insertion depths ranging from 3 mils to 23 mils into the CC plug in the recess. In this case, and unlike the prior art example above, the resistance measured across all insertion depths was consistently less than 1 Ohm. This low resistance across all insertion depths shows that the use of the metallized layer in the interconnect substantially eliminates any correlation of resistance with respect to pin insertion depth. Further, these low resistance values across pin insertion depths are correlated with reliable electrical connections at the interconnect.

The interconnects discussed herein can provide for reliable electrical connections, such as between different electronics or circuit boards. For example, the interconnects can be used as part of an array of interconnects in various electronics. In some applications, there may be thousands of interconnects needed. The reliability provided by the metallized layer as described herein provides for interconnects that are reliable despite manufacturing variances such that failure of the interconnects due to increased resistance at the interconnect is minimized.

Figure 2:
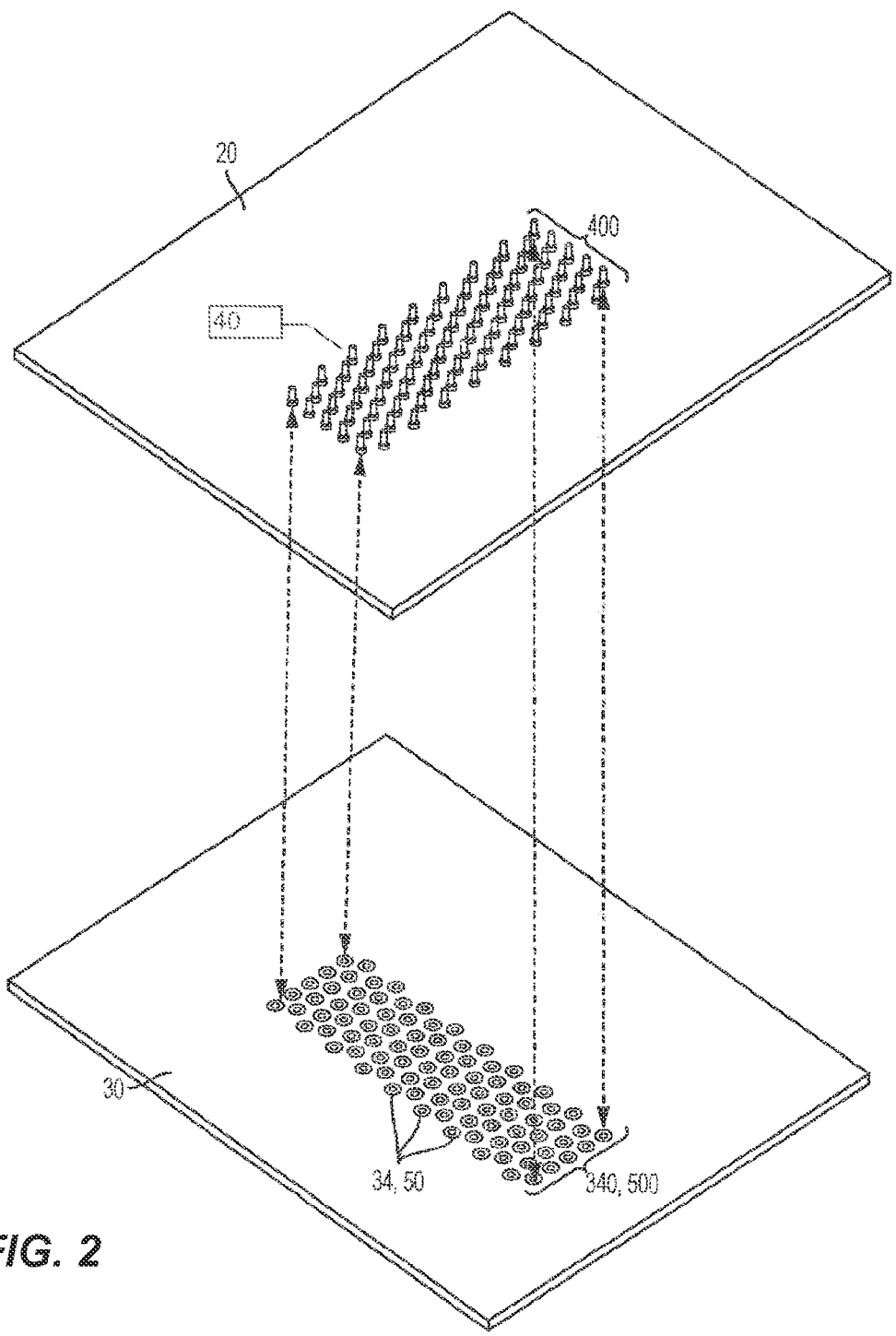
FIG. 2 is a partial exploded view of the first and second bodies of an interconnect assembly comprising an array of interconnects of FIG. 1.

An example of an array of interconnects as part of an interconnect assembly is shown with reference to FIG. 2. The interconnects in the array of interconnects can each be configured in accordance with the interconnect of FIG. 1, as discussed above. In this example, the second body 30 of the interconnect assembly can be formed to define multiple recesses 34 in an array of recesses 340. Similar to the recess 34 discussed above and shown in FIG. 1, each of the recesses 34 in the array of recesses 340 can comprise the metallized layer 70 as shown in FIG. 1. In such cases, the pin connector 40 and the CC plug 50 can each be provided as a plurality of pin connectors 40 and a plurality of CC plugs 50, respectively. Such pluralities of pin connectors 40 and CC plugs 50 can be disposed in numerical and positional correspondence with the multiple recesses 34 such that the pin connectors 40 are provided in an array of pin connectors 400, which corresponds to the array of recesses 340, and such that the CC plugs 50 are provided in an array of CC plugs 500, which corresponds to the array of recesses 340. The pitch of the respective arrays 340, 400 and 500 can be as small as permitted by PWB or semi-conductor technology and as small as needed for specific applications (e.g., 200 or more interconnects and associated connections per square inch).

Where the recesses 34, the pin connectors 40, and the CC plugs 50 are provided in the respective arrays 340, 400 and 500, assembly of the interconnect assembly can involve the penetration of the plurality of CC plugs 50 by the pins 42 of each of the pin connectors 40. Such penetration can take place simultaneously, such that the total force required to complete the penetration is a multiple of the force required to complete the penetration of a single CC plug 50 by a single pin 42. The CC plugs 50 can be configured such that this total force is limited to a predefined level.

Figure 3:
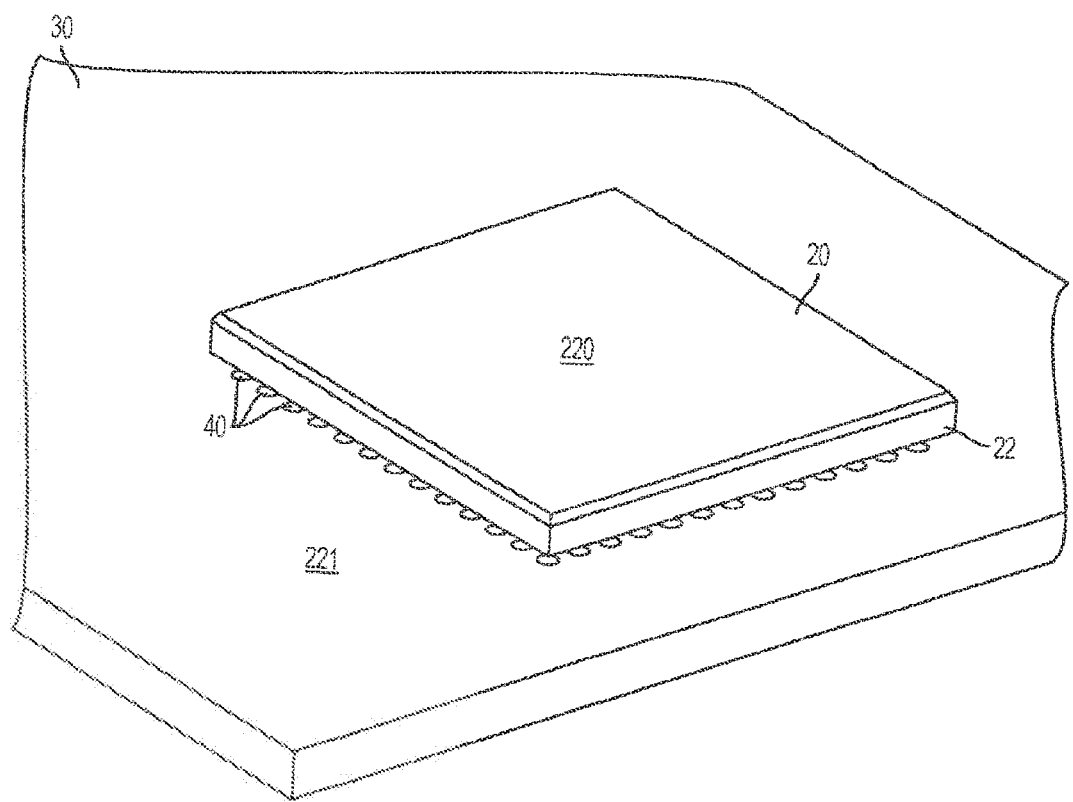
FIG. 3 is an isometric view of a chip package assembly comprising the array of interconnects of FIG. 1.

With reference to FIGS. 1-3, in accordance with particular examples in which at least one of the first and second bodies 20 and 30 is provided as the chip package 22, as shown in FIG. 3, the respective arrays 340, 400 and 500 of the recesses 34, the pin connectors 40 and the CC plugs 50 can be provided in place of a land grid array (LGA) or a ball grid array (BGA). For example, the pin connectors 40 can be soldered to an underside of a chip element 220 (taking the place of the first body 20 described herein) with their respective pins 40 penetrating into corresponding CC plugs 50 of a circuit board 221 (taking the place of the second body 30 described herein). Assembly of such a chip package 22 could therefore be completed without need for soldering or associated thermal cycling.

Figure 4:
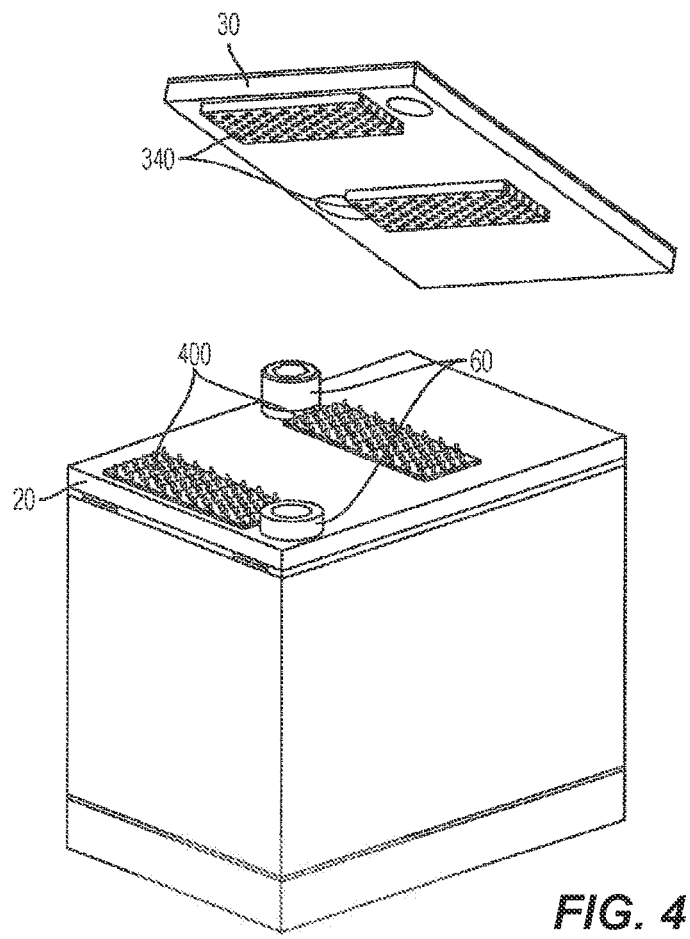
FIG. 4 is an isometric view of an interconnect assembly, comprising the first and second bodies and the array of interconnects shown in FIG. 2.
Figure 5:
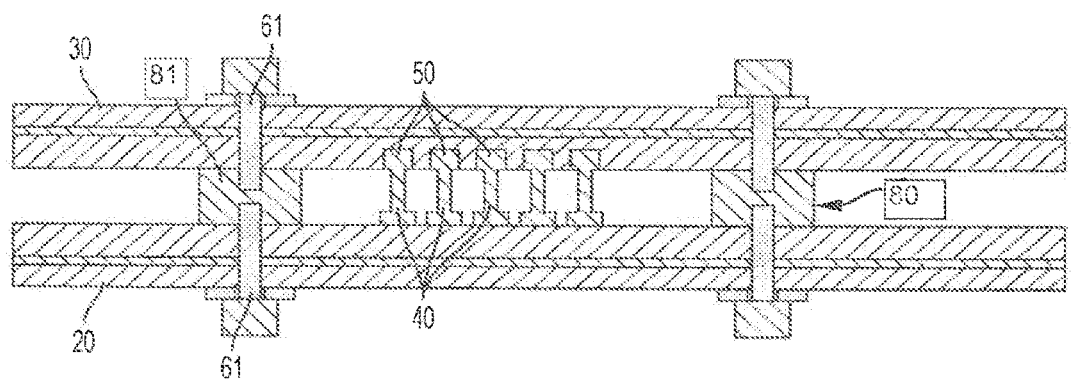
FIG. 5 is a partial section view of the interconnect assembly of FIG. 4.

With reference to FIGS. 4 and 5, the interconnect assembly can include mounting hardware 60 that is configured to secure the first and second bodies 20 and 30 together and spacers 80, which are spatially interposed between the first and second bodies 20 and 30 to insure that the CC plugs 50 are not axially compressed along the axial direction as a result of the first and second bodies 20 and 30 being brought together along the axial direction by an excessive distance. As shown in FIGS. 4 and 5, the mounting hardware 60 can be provided as screw elements 61 and the spacers 80 can be provided as spacer elements 81 where the screw elements 61 are rotatably drivable into the spacer elements 81 in order to draw the first body 20 toward the second body 30 in a tightening direction. The thickness of the spacer elements 81 can thus be provided such that the pins 42 of each of the pin connectors 40 penetrates into the CC plugs 50 by a given depth, which is less than the depth of the CC plugs 50 and the recesses 34.

Figure 6:
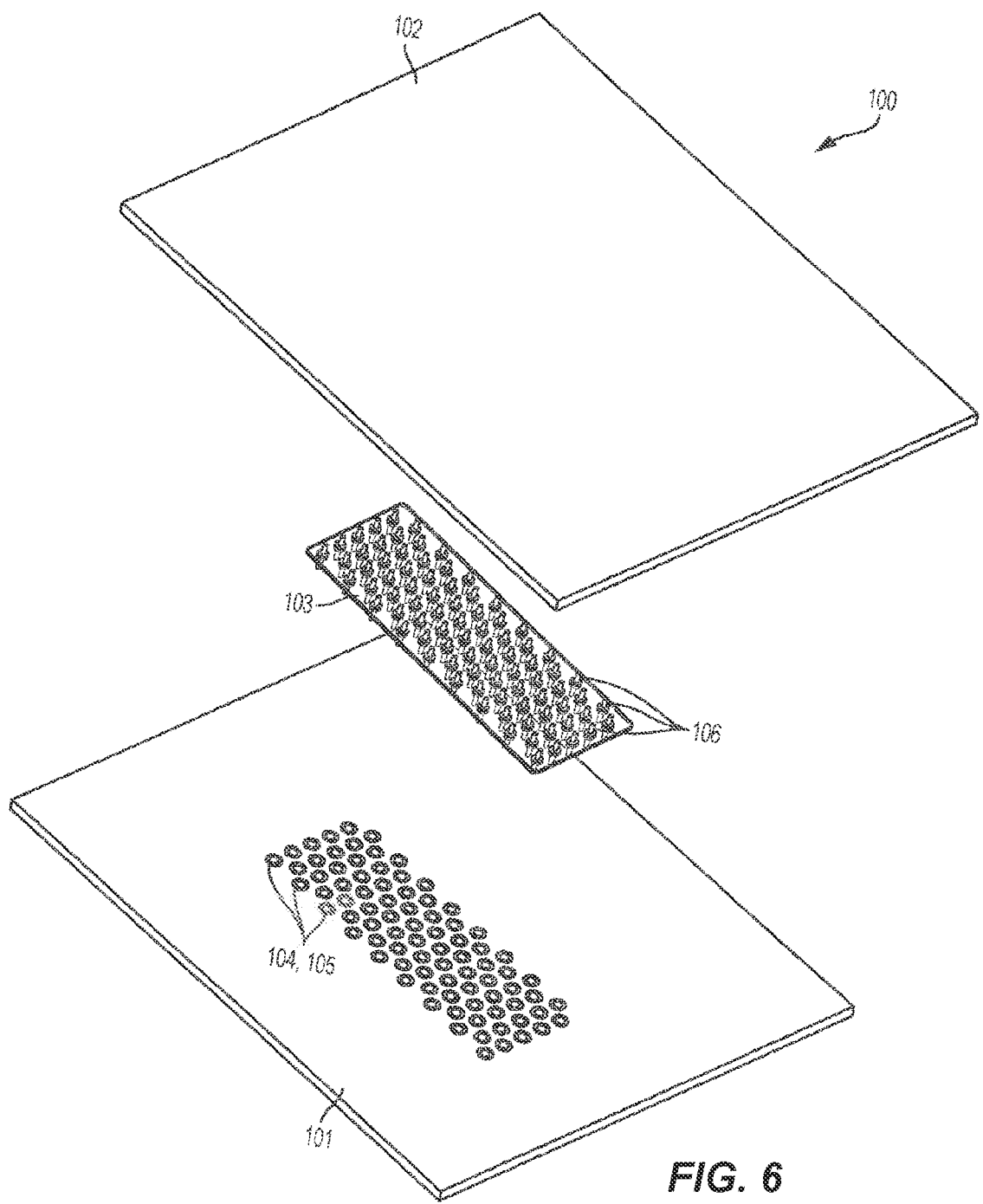
FIG. 6 is an exploded view of components of another example of an interconnect assembly comprising an intermediate carrier and an array of interconnects as shown in FIG. 1.
Figure 7:
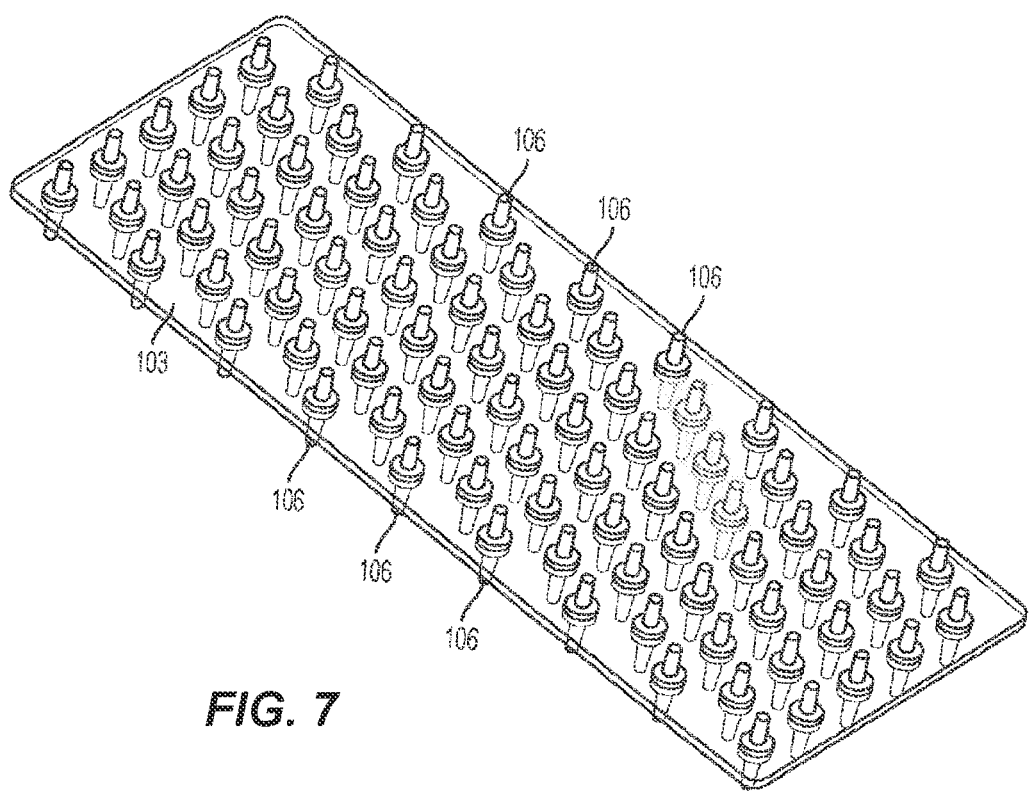
FIG. 7 is an isometric view of the intermediate carrier of the interconnect assembly shown in FIG. 6.

With reference to FIGS. 6 and 7, an interconnect assembly 100 is provided and includes some features which are similar to those described above, and which therefore need not be described in detail further below. In this example, the interconnect assembly 100 includes a first body 103 that comprises an intermediate carrier, a second body 101, a third body 102 and a plurality of CC plugs 104. As indicated above, the second and third bodies 101 and 102 can be provided as circuit boards or as chip package elements. The second body 101 includes first circuitry and is formed to comprise a plurality of first recesses 105 in which a respective one of the plurality of CC plugs 104 are disposable. The third body 102 includes second circuitry and is formed to comprise a plurality of second recesses (not shown in FIG. 6 but essentially opposite from the plurality of first recesses 105) in which a plurality of CC plugs are disposable. Each of the recesses 105 and the recesses in the third body 102 can comprise a distributed metallized layer and can be configured similar to the recesses discussed above with reference to the interconnect of FIG. 1. The intermediate carrier 103 can be a planar body that is interposable between the second and third bodies 101 and 102. The intermediate carrier 103 includes first and second sides and a plurality or array of male conductive elements supported on each of the first and second sides that, in this example, can comprise pin connectors 106 which are affixed to the first and second sides, respectively. The CC plugs 104 are disposed within the recesses 105 of the second body 101 and the recesses of the third body 102, such that they are disposed in electrical connection with the first and second circuitry, respectively. The distributed metallized layer in each of the recesses facilitates an electrical connection between the first and second circuitry similar to that described above. The intermediate carrier 103 can be positioned relative to the second and third bodies 101, 102, such that the pin connectors 106 on each side of the intermediate carrier 103 are aligned with and inserted, at least partially, into the CC plugs 104 and the recesses of the second and third bodies 101, 102 (e.g., recesses 105 on the second body 101), respectively, to establish the electrical connection.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The use of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. An interconnect, comprising:
    a recess formed in a body, and comprising an axial end wall and a side wall extending from the axial end wall to the outer surface;
    a distributed metallized layer disposed, at least in part, on the axial end wall and the side wall; and
    a conductive compliant (CC) plug disposed within the recess to interface with the metallized layer, the CC plug including a recess formed therein sized and arranged to receive a male conductive element therein and being configured to establish an electrical connection between the male conductive element and the metallized layer with the male conductive element out of direct contact with the metallized layer;
    wherein the CC plug comprises at least one or more of: conductive polymer, foamed metal, and conductive foamed plastic.

2. The interconnect of claim 1, wherein the male conductive element comprises a pin connector.

3. The interconnect of claim 1, wherein the conductive pad is disposed on the axial end wall of the recess.

4. The interconnect of claim 3, wherein at least a portion of the distributed metallized layer is disposed on the conductive pad.

5. The interconnect of claim 1, wherein the distributed metallized layer completely covers the axial end wall and side wall of the recess.

6. An interconnect assembly comprising:
    a first body comprising a male conductive element supported on an outer surface of the first body;
    a second body having second circuitry, the second body comprising a recess disposed on an outer surface of the second body;
    a distributed metallized layer disposed, at least in part, within the recess and that is in electrical connection with the second circuitry;
    a conductive compliant (CC) plug disposed within the recess to interface with the metallized layer;
    wherein the CC plug comprises at least one or more of: conductive polymer, foamed metal, and conductive foamed plastic.

7. The interconnect assembly of claim 6, wherein the second body further comprises a conductive pad disposed on an axial end wall of the recess, the conductive pad being in electrical connection with the second circuitry and the distributed metalized layer.

8. The interconnect assembly of claim 7, wherein the distributed metallized layer is disposed on the conductive pad.

9. The interconnect assembly of claim 6, wherein the second body comprises multiple recesses in array, each of the recesses comprising a respective distributed metallized layer and a CC plug, and wherein the first body comprises multiple male conductive elements in array, each of the multiple male conductive elements being inserted, at least partially, into a respective one of the multiple recesses of the second body.

10. The interconnect assembly of claim 6, wherein the first body comprises first circuitry in electrical contact with the male conductive element.

11. The interconnect assembly of claim 6, further comprising a third body, wherein the third body comprises a recess disposed on an outer surface of the third body and a distributed metalized layer disposed, at least in part, within the recess of the third body, wherein the first body is an intermediate carrier comprising a second male conductive element supported on a second outer surface of the first body, wherein the male conductive element is inserted into the recess of the second body, and wherein the second male conductive element is inserted into the recess of the third body.

12. The interconnect assembly of claim 11, wherein the third body comprises multiple recesses in array, each of the recesses of the third body comprising a respective distributed metalized layer and a CC plug, and wherein the intermediate carrier comprises multiple second male conductive elements in array inserted into a respective one of the multiple recesses of the third body.

13. A method for manufacturing an interconnect, the method comprising:
    forming a recess in a body, the recess comprising an axial end wall and a side wall extending from the axial end wall, a connection pad being disposed on the axial end wall;
    depositing a metallized layer to be distributed within the recess on the axial end wall and the side wall to be in electrical connection with the connection pad;
    inserting a conducting compliant (CC) plug into the recess, the CC plug being configured to establish an electrical connection between the connection pad and a male conductive element inserted into the recess via the metallized layer;
    wherein the CC plug comprises at least one or more of: conductive polymer, foamed metal, and conductive foamed plastic.

14. The method of claim 13, wherein the metallized layer is deposited via sputtering.

15. The method of claim 13, wherein the recess is formed via etching or laser machining the recess out of the body.

16. The method of claim 13, further comprising forming an array of recesses.

17. The method of claim 13, wherein the metallized layer is uninterrupted throughout an area where the metallized layer and the CC plug overlap within the recess.

18. The method of claim 13, wherein the metallized layer substantially covers the axial end wall and the side wall.

19. The method of claim 13, wherein the body is formed as a part of a printed circuit board.

* * * * *